US006773855B1

(12) United States Patent
Iijima et al.

(10) Patent No.: US 6,773,855 B1
(45) Date of Patent: Aug. 10, 2004

(54) LOW-RADIATION, PHOTOCURABLE AND THERMOSETTING RESIN COMPOSITION AND CURED FILM THEREOF

(75) Inventors: Tatsuya Iijima, Kawagoe (JP); Hirohide Sato, Higashimatsuyama (JP); Takahiro Yoshida, Higashimatsuyama (JP); Takeshi Yoda, Higashimatsuyama (JP)

(73) Assignee: Taiyo Ink Manufacturing Co., Ltd. (JP)

( * ) Notice: Subject to any disclaimer, the term of this patent is extended or adjusted under 35 U.S.C. 154(b) by 0 days.

(21) Appl. No.: 10/437,199

(22) Filed: May 14, 2003

(30) Foreign Application Priority Data

May 15, 2002 (JP) ........................................ 2002-140248

(51) Int. Cl.[7] .............................................. G03F 7/075
(52) U.S. Cl. ......................... 430/18; 430/280.1; 522/77
(58) Field of Search ............................... 430/280.1, 18; 522/77

(56) References Cited

U.S. PATENT DOCUMENTS

| | | | | |
|---|---|---|---|---|
| 4,816,299 A | * | 3/1989 | Alpha et al. ................. | 427/221 |
| 5,158,990 A | * | 10/1992 | Bayer et al. .................... | 522/83 |
| 5,530,036 A | * | 6/1996 | Sano et al. ..................... | 522/79 |
| 5,714,086 A | * | 2/1998 | Osuna et al. ........... | 252/182.18 |
| 6,190,834 B1 | * | 2/2001 | Narahara et al. ......... | 430/284.1 |
| 2002/0027268 A1 | * | 3/2002 | Tanaka et al. .............. | 257/666 |

FOREIGN PATENT DOCUMENTS

| JP | 11-288091 A1 | 10/1999 |
|---|---|---|
| JP | 11-315107 A1 | 11/1999 |

OTHER PUBLICATIONS

Akio et al, Patent Abstracts of Japan Publication No. 11-315107 and attached machine translation obtained for JPO web site dated copyright 1998, 18 pages.*

Akio et al, Patent Abstracts of Japan Publication No. 11-288091 and attached machine translation obtained from JPO web site dated copyright 1998, 16 pages.*

National Material Advisory Board, Materials for High-Density Electronic Packaging and Interconnection (1990), NMAB-449, National Academy PRess, 1990, pp. 71-76, www.nap.edu/openbook/030904233X/html.R1.html, The Natioal Academy of Sciences.*

* cited by examiner

*Primary Examiner*—Cynthia Hamilton
(74) *Attorney, Agent, or Firm*—Rader, Fishman & Grauer PLLC

(57) ABSTRACT

A photocurable and thermosetting resin composition comprises (A) a high purity synthetic silica powder having a uranium content of not more than 1.0 ppb, (B) a photosensitive prepolymer containing a carboxylic group and at least two ethylenically unsaturated groups in its molecule and having an acid value of solid content of 50 to 150 mg KOH/g, (C) a photosensitive (meth)acrylate compound, (D) a photopolymerization initiator, (E) an epoxy resin, and (F) a curing catalyst. A cured film which emits alpha rays at a fully low dose is obtained by forming a film of the composition on a substrate, subjecting the film to exposure to light and development, and finally curing the coating film by irradiation with active energy rays and/or thermal curing.

10 Claims, No Drawings

LOW-RADIATION, PHOTOCURABLE AND THERMOSETTING RESIN COMPOSITION AND CURED FILM THEREOF

BACKGROUND OF THE INVENTION

1. Field of the Invention

This invention relates to a low radiation, photocurable and thermosetting resin composition which is advantageously used as a solder resist to be used in the manufacture of rigid printed circuit boards, flexible printed circuit boards, and LSI packages such as BGA (ball grid array), CSP (chip size package) and tape carrier packages. More particularly, this invention relates to an alkali-developable, photocurable and thermosetting resin composition capable of forming a cured film which emits alpha rays which affect semiconductor elements in a fully low dose and excels in such properties as heat resistance, adhesiveness, whethering resistance, resistance to electroless plating, electrical properties, and resistance to PCT (pressure cooker test) required of the solder resist for IC packages, its cured film and a printed circuit board having a solder resist film formed from the cured film.

2. Prior Art

In general, as a solder resist for the industrial grade printed circuit boards, a liquid developing type solder resist which is irradiated with ultraviolet light and then developed to form an image and thereafter finally cured (finish curing) by heating and exposure to light is adopted from the viewpoint of ensuring highly accurate formation of circuits with high density. Further, with due respect to the problem of environmental safety, the liquid solder resist of the alkali developing type which implements development with a dilute aqueous alkali solution as a developer has come to play the leading role.

Furthermore, in view of high densification of the printed circuit board to cope with the recent trend of electronic devices toward decreasing weight and size, the IC packages called BGA (ball grid array), CSP (chip scale package), etc. are recently used instead of the IC packages called QFP (quad flat-pack package), SOP (small outline package), etc. These new packages have such structure that metals such as ball-like solder are arranged in an area on one side of a printed circuit board having a solder resist applied thereto, the semiconductor elements are directly connected thereto on the other side by wire bonding or through the medium of the bumps etc., and they are sealed by a sealing resin. As the solder resists which can be advantageously used for these packages, the compositions as disclosed in published Japanese Patent Applications, JP 11-315107,A and JP 11-288091,A may be cited.

In the above-mentioned resin composition for sealing the semiconductor, a general-purpose silica powder was conventionally used as an inorganic filler. However, such a silica powder is the crystalline silica obtained only by grinding a natural silica powder or molten silica (amorphous silica) obtained by grinding the natural silica powder after melting. Since these silica materials contain radioactive materials, such as uranium and thorium, they pose the problem that a semiconductor element is operated incorrectly due to alpha rays emitted therefrom. Particularly in the recent semiconductor memory elements having a remarkably increased degree of accumulation, this incorrect operation will cause a serious problem.

Moreover, in the solder resist to be used for a printed circuit board, inorganic fillers such as barium sulfate, barium titanate, powdered silicon oxide, amorphous silica, talc, clay, calcined kaolin, magnesium carbonate, calcium carbonate, aluminum oxide, aluminum hydroxide, and mica powder are used for the purpose of relaxing strain or imparting printability thereto. These fillers are obtained only by grinding the natural ore and subjecting the resultant powder to a chemical treatment or heat treatment and have not undergone the high purifying processing to remove the radioactive materials therefrom. Accordingly, it is expected that the semiconductor elements will be incorrectly operated due to alpha rays emitted from the inorganic filler in the solder resist.

Under such circumstances, in order to prevent incorrect operation of semiconductor elements, the solder resist which emit alpha rays in a lower dose is strongly desired as the solder resist to be used for LSI packages such as BGA (ball grid array), CSP (chip size package), and TCP (tape career package).

SUMMARY OF THE INVENTION

An object of the present invention, therefore, is to provide an alkali-developable, photocurable and thermosetting resin composition capable of forming a cured film which emits alpha rays which affect semiconductor elements in a fully low dose and excels in such properties as heat resistance, adhesiveness, whethering resistance, resistance to electroless plating, electrical properties, and PCT resistance required of the solder resist for IC packages, its cured film and a printed circuit board having a solder resist film formed from the cured film.

To accomplish the object mentioned above, the present invention provides an alkali-developable, photocurable and thermosetting resin composition characterized by comprising (A) a high purity synthetic silica powder having a uranium content of not more than 1.0 ppb (parts per billion) in place of the conventionally used natural inorganic filler, and further (B) a photosensitive prepolymer containing a carboxylic group and at least two ethylenically unsaturated groups in its molecule and having an acid value of solid content of 50 to 150 mg KOH/g, (C) a photosensitive (meth)acrylate compound, (D) a photopolymerization initiator, (E) an epoxy resin, and (F) a curing catalyst in combination. The term "(meth)acrylate" as used in this specification means acrylate, methacrylate, or a mixture thereof. This holds good for the similar expression.

In accordance with another aspect of the present invention, there is provided a cured film obtained by a method which comprises a step of forming a resist pattern on a substrate by forming a film of the photocurable and thermosetting resin composition mentioned above on the substrate and subjecting the film to exposure to light and development and a step of curing the film of the resultant resist pattern. The formation of the film on the substrate is performed by applying the photocurable and thermosetting resin composition mentioned above to the substrate and drying it or by laminating a dry film of the photocurable and thermosetting resin composition mentioned above on the substrate. The step of curing the coating film is carried out by subjecting to irradiation with active energy rays and subsequent thermal curing, or to thermal curing and subsequent irradiation with active energy rays, or to thermal curing only.

In accordance with still another aspect of the present invention, there is provided a printed circuit board having a solder resist film formed on a circuit board provided with a conductor layer of a prescribed circuit pattern, characterized in that the solder resist film mentioned above is formed from a cured film of the photocurable and thermosetting resin composition mentioned above. The cured film is obtained by subjecting the photocurable and thermosetting resin composition mentioned above to irradiation with active energy rays and/or thermal curing.

Since the cured film formed from the photocurable and thermosetting resin composition of the present invention emits alpha rays which affect semiconductor elements in a fully low dose and excels in such properties as heat resistance, adhesiveness, whethering resistance, resistance to electroless plating, electrical properties, and PCT resistance required of the solder resist for IC packages, it is possible to manufacture the highly reliable LSI packages which will not be incorrectly operated.

DETAILED DESCRIPTION OF THE INVENTION

Now, the components of the photocurable and thermosetting resin composition of the present invention will be described in detail below.

First, a high purity synthetic silica powder of the component (A) is a high purity molten silica powder which has undergone the high purifying processing to remove radioactive materials, such as uranium and thorium. The photocurable and thermosetting resin composition of the present invention is intended to fully reduce the radiation dose of alpha rays by using the high purity synthetic silica powder having a uranium content of not more than 1.0 ppb, thereby preventing incorrect operation of the semiconductor element.

The methods for production of such a high purity synthetic silica powder include a method of neutralizing an alkali silicate, drying the resultant gel, pulverizing the dried gel, and frame melting the resultant powder, a method of flame decomposing an alkoxysilane, a method of carrying out vapor phase hydrolysis of such a volatile silicon compound as silicon tetrachloride, and a method of carrying out a flame melting treatment of a wet synthetic silica obtained by an ion exchanging treatment of sodium metasilicate as a raw material, as disclosed in JP 61-40811,A.

In order to prevent incorrect operation of the semiconductor element caused by an inorganic filler, particularly silica, as mentioned above, the uranium content in the high purity synthetic silica powder (A) should be not more than 1.0 ppb, preferably not more than 0.6 ppb.

Moreover, an average particle diameter of the high purity synthetic silica powder (A) is desired to be not more than 10.0 μm, preferably not more than 5.0 μm from the viewpoints of its dispersibility in the photocurable and thermosetting resin composition, the printability of the composition, and the resolving power of the resist pattern. The suitable content of such a high purity synthetic silica powder is 5 to 40 parts by weight, preferably 10 to 30 parts by weight, based on 100 parts by weight of the photocurable and thermosetting resin composition to maintain the characteristics of the coating film and to maintain the printability. If the content of the high purity synthetic silica powder is less than 5 parts by weight, it will bring such undesirable results that the cured film formed of the composition is distorted in the surface touching a semiconductor etc. and the proper printability is no longer obtained. Conversely, the content exceeding 40 parts by weight is undesirable because the printability of the composition will be deteriorated and the strength of the coating film will be decreased.

As the low alpha rays radiative and high purity synthetic silica powder, Adma Fine SO series manufactured by Tatsumori K.K., PURELEX DEP series, VL series and VLM series manufactured by Tatsumori K.K., FR series and FB series manufactured by Denki Kagaku Kogyo K.K., and PP-7B manufactured by Tonen Petroleum Chemicals K.K. may be cited. These products may be used either singly or in form of a combination of two or more members by selecting the particle diameter and the grain size distribution depending on the usage.

The photosensitive prepolymer (B) mentioned above is a photosensitive prepolymer containing a carboxylic group and at least two ethylenically unsaturated groups in its molecule. As concrete examples thereof, there can be cited such prepolymers as (1) a photosensitive prepolymer obtained by the reaction of (a) a polyfunctional epoxy compound having at least two epoxy groups in its molecule with (b) an unsaturated monocarboxylic acid and the subsequent reaction of (c) a saturated or unsaturated polybasic acid anhydride with the resultant hydroxyl group, and (2) a photosensitive prepolymer obtained by the reaction of (a) a polyfunctional epoxy compound having at least two epoxy groups in its molecule with (b) an unsaturated monocarboxylic acid and (d-1) a compound having one reactive group other than an alcoholic hydroxyl group capable of reacting with an epoxy group in its molecule, preferably (d-2) a compound having at least one alcoholic hydroxyl group and one reactive group other than an alcoholic hydroxyl group capable of reacting with an epoxy group in its molecule, and the subsequent reaction of (c) a saturated or unsaturated polybasic acid anhydride with the resultant product.

The acid value of such a photosensitive prepolymer (B) mentioned above, though having an appropriate range thereof varied with the kind of prepolymer, should generally fall in the range of 50 to 150 mg KOH/g, preferably in the range of 60 to 120 mg KOH/g. Any deviation of the acid value from the aforementioned range is undesirable because the resin will manifest insufficient solubility in an aqueous alkali solution if the acid value is less than 50 mg KOH/g. Conversely, the acid value exceeding 150 mg KOH/g will give cause to deteriorate the various properties of the cured film such as resistance to alkalis and electrical properties expected of a resist.

The photosensitive prepolymer (1) mentioned above is a carboxyl group-containing photosensitive resin obtained by the reaction of (a) a polyfunctional epoxy compound having at least two epoxy groups in its molecule, preferably a solid polyfunctional epoxy compound, with (b) a photosensitive unsaturated monocarboxylic acid and the subsequent reaction of (c) a saturated or unsaturated polybasic acid anhydride with the resultant hydroxyl group.

As the polyfunctional epoxy compound (a) mentioned above, various well-known and popularly adopted epoxy resins such as, for example, glycidyl ether compounds such as bisphenol A type epoxy resin, bisphenol F type epoxy resin, bisphenol S type epoxy resin, brominated bisphenol A type epoxy resin, hydrogenated bisphenol A type epoxy resin, biphenol type epoxy resin, bixylenol type epoxy resin, phenol novolak type epoxy resin, cresol novolak type epoxy resin, brominated phenol novolak type epoxy resin, novolak type epoxy resin of bisphenol A, trihydroxyphenyl methane type epoxy resins, tetraphenylol ethane type epoxy resins, naphthalene skeleton-containing phenol novolak type epoxy resins, and dicyclopentadiene skeleton-containing phenol novolak type epoxy resins; alicyclic epoxy resins represented by EHPE-3150 (trade name) produced by Daicel Chemical Industries, Ltd.; and other well-known and popularly adopted epoxy compounds such as, for example, copolymers of glycidyl (meth)acrylate and a compound containing an ethylenically unsaturated double bond may be used. Among other epoxy resins cited above, the phenol novolak type epoxy resin and the cresol novolak type epoxy resin which are solid and polyfunctional prove to be particularly desirable. These epoxy resins may be used either singly or in the form of a combination of two or more members.

As typical examples of the unsaturated monocarboxylic acids (b) mentioned above, acrylic acid, methacrylic acid, itaconic acid, and the compounds obtained by the addition of a polybasic acid anhydride to β-carboxylethyl acrylate, β-carboxylethyl methacrylate or hydroxyl group-containing (meth) acrylate may be cited. Among other unsaturated monocarboxylic acids cited above, acrylic acid and methacrylic acid prove to be particularly desirable from the viewpoint of the photosensitivity, reactivity and the storage stability of the composition. These unsaturated monocarboxylic acids (b) may be used either singly or in the form of a mixture of two or more members.

The ratio of addition of the unsaturated monocarboxylic acid (b) to the polyfunctional epoxy compound (a) mentioned above is preferred to be 0.95 to 1.10 equivalent weights per one equivalent weight of an epoxy group of the polyfunctional epoxy compound. If the amount of addition of the unsaturated monocarboxylic acid is less than 0.95 equivalent weight, it is at a disadvantage that unreacted epoxy groups remain and the storage stability of the resultant prepolymer after addition of the saturated or unsaturated polybasic acid anhydride will be deteriorated. Conversely, if the amount exceeds 1.10 equivalent weights, it is at a disadvantage that the unreacted unsaturated monocarboxylic acid remains and an offensive smell will be increased.

As the saturated or unsaturated polybasic acid anhydrides (c) mentioned above, alicyclic dibasic acid anhydrides such as methyltetrahydrophthalic anhydride, tetrahydrophthalic anhydride, hexahydrophthalic anhydride, methylhexahydrophthalic anhydride, nadic anhydride, 3,6-endomethylenetetrahydrophthalic anhydride, methylendomethylenetetrahydrophthalic anhydride, and tetrabromophthalic anhydride; aliphatic or aromatic dibasic acid anhydrides such as succinic anhydride, maleic anhydride, itaconic anhydride, octenylsuccinic anhydride, pentadodecenylsuccinic anhydride, phthalic anhydride, and trimellitic anhydride may be cited. These saturated or unsaturated polybasic acid anhydrides may be used either singly or in the form of a combination of two or more members. Among other polybasic acid anhydrides cited above, alicyclic dibasic acid anhydrides prove to be particularly desirable from the viewpoint of developability.

The amount of addition of the saturated or unsaturated polybasic acid anhydride (c) is preferred to be in such a proportion that the anhydride group is in the range of 0.3 to 0.8 equivalent weight per one equivalent weight of an alcoholic hydroxyl group caused by the reaction of the polyfunctional epoxy compound (a) with the unsaturated monocarboxylic acid (b) mentioned above and that the acid value of the produced photosensitive prepolymer (B) falls in the range of 50 to 150 mg KOH/g, preferably 60 to 120 mg KOH/g.

The photosensitive prepolymer (2) mentioned above is a carboxyl group-containing photosensitive resin obtained by the reaction of (a) a polyfunctional epoxy compound having at least two epoxy groups in its molecule, preferably a solid polyfunctional epoxy compound, with (b) an unsaturated monocarboxylic acid which is photosensitive and (d-1) a compound having one reactive group (for example, carboxyl group, phenolic hydroxyl group, secondary amino group, etc.) other than an alcoholic hydroxyl group capable of reacting with an epoxy group in its molecule, preferably (d-2) a compound having at least one alcoholic hydroxyl group and one reactive group other than an alcoholic hydroxyl group capable of reacting with an epoxy group in its molecule, and the subsequent reaction of (c) a saturated or unsaturated polybasic acid anhydride with the resultant product.

By the reaction of the compound having one reactive group other than an alcoholic hydroxyl group capable of reacting with an epoxy group in its molecule to the polyfunctional epoxy compound, though the density of photosensitive groups decreases in comparison with the photosensitive prepolymer (1) mentioned above, the hydrophobic nature of the resultant resin may be increased depending on the selection of the compound and thus the resistance to gold plating and PCT resistance may be improved. As the compound (d-1) having one reactive group other than an alcoholic hydroxyl group capable of reacting with an epoxy group in its molecule, alkyl phenols such as pentyl phenol, dipentyl phenol, octyl phenol, nonyl phenol, dodecyl phenol, and hexadodecyl phenol; and monocarboxylic acids such as n-hexanoic acid, dimethyl butyrate, ethyl butyrate, benzoic acid, toluic acid, and ethyl benzoate may be cited. Among other compounds cited above, nonyl phenol and dodecyl phenol having the hydrophobic nature prove to be particularly desirable for the purpose of improving the resistance to gold plating and PCT resistance.

Furthermore, by the reaction of the compound (d-2) having at least one alcoholic hydroxyl group, preferably primary alcoholic hydroxyl group, and one reactive group other than an alcoholic hydroxyl group capable of reacting with an epoxy group in its molecule to the polyfunctional epoxy compound, though the density of photosensitive groups decreases in comparison with the photosensitive prepolymer (1) mentioned above, the carboxyl group is introduced into the site apart from the main skeleton when the saturated or unsaturated polybasic acid anhydride (c) is caused to react with the resultant product. As the result, the resultant photosensitive prepolymer has the flexibility and can be developed even if it has a low acid value.

The synthesis of the photosensitive prepolymer (2) mentioned above is attained by the first method which comprises causing an unsaturated monocarboxylic acid (b) [or a compound (d-1, d-2)] to react with a polyfunctional epoxy compound (a), then causing a compound (d-1, d-2) [or an unsaturated monocarboxylic acid (b)] to react with the resultant reaction product and subsequently further reacting the saturated or unsaturated polybasic acid anhydride (c) to the resultant reaction product, or by the second method which comprises causing simultaneous reaction of the polyfunctional epoxy compound (a), the unsaturated monocarboxylic acid (b), and the compound (d-1, d-2) and then further reacting the saturated or unsaturated polybasic acid anhydride (c) to the resultant reaction product. Though these two methods are both available, the second method proves more advantageous. Appropriately, the reaction mentioned above is accomplished between one equivalent weight of the epoxy group of the polyfunctional epoxy compound (a) and a total of 0.8 to 1.3 mols, preferably 0.9 to 1.1 mols, of the unsaturated monocarboxylic acid (b) and the compound (d-1, d-2) mentioned above. Properly, the ratio of the amounts of the unsaturated monocarboxylic acid (b) and the aforementioned compound (d-1, d-2) to be used is such that the amount of the compound (d-1, d-2) to be used may fall in the range of 0.05 to 0.5 mol, preferably 0.1 to 0.3 mol, based on 1 mol of the total of the amounts of the unsaturated monocarboxylic (b) acid and the compound (d-1, d-2).

As the compound (d-2) having at least one alcoholic hydroxyl group, preferably primary alcoholic hydroxyl group, and one reactive group other than an alcoholic hydroxyl group capable of reacting with an epoxy group in its molecule, for example, polyhydroxy monocarboxylic acids such as dimethylol propionic acid, dimethylol acetic acid, dimethylol butyric acid, dimethylol valeric acid, and dimethylol caproic acid; hydroxyalkyl phenols or hydroxyalkyl cresols such as bis(hydroxymethyl) phenol, hydroxymethyl-di-t-buthyl phenol, p-hydroxyphenyl-2-methanol, p-hydroxyphenyl-3-propanol, p-hydroxyphenyl-4-butanol, hydroxyethyl cresol, 2,6-dimethyl-4-hydroxymethyl phenol, 2,4-dihydroxymethyl-2-cyclohexyl phenol, trimethylol phenol, and 3,5-dimethyl-2,4,6-trihydroxymethyl phenol; esterification products of a phenol having a carboxyl group-containing substituent such as hydroxybenzoic acid, hydroxyphenylbenzoic acid and hydroxyphenoxybenzoic acid with ethylene glycol, propylene glycol, glycerol, diethylene glycol, etc.; monoethylene oxide adduct of bisphenol, monopropylene oxide adduct of bisphenol; p-hydroxyphenetyl alcohol; and dialkanol amines such as diethanol amine and diisopropanol amine may be cited. As the particularly preferred compounds, dimethylol propionic acid and p-hydroxyphenetyl alcohol, for example, may be cited.

As the photosensitive (meth)acrylate compound (C) mentioned above, any photosensitive (meth)acrylate compound having one or more (meth)acryloyl groups in its molecule and assuming a liquid state, solid state, or semi-solid state at normal room temperature may be used. The photosensitive (meth)acrylate compound is used for the purpose of exalting the photochemical reactivity of the composition. The photosensitive (meth)acrylate compound which is in a liquid state at normal room temperature will play the role of adjusting the composition to such a degree of viscosity suitable for a varying method of application and aiding in enhancing the solubility of the composition in an aqueous alkali solution besides the purpose of exalting the photochemical reactivity of the composition. However, the use of the photosensitive (meth)acrylate compound assuming a liquid state at normal room temperature in a large amount is not preferred, because the produced coating film does not easily acquire necessary finger-touch dryness and tends to have their properties degraded. The amount of the photosensitive (meth)acrylate compound (C) to be incorporated into the composition is preferred to be in the range of 10 to 50 parts by weight, based on 100 parts by weight (as a solid content, this holds good for the same expression to be described hereinafter) of the aforementioned photosensitive prepolymer (B).

As the photosensitive (meth)acrylate compounds (C) mentioned above, for example, hydroxyl group-containing acrylates such as 2-hydroxyethyl acrylate, 2-hydroxypropyl acrylate, pentaerythritol triacrylate, and dipentaerythritol pentaacrylate; water-soluble acrylates such as polyethylene glycol diacrylate and polypropylene glycol diacrylate; acrylates of polyfunctional alcohol such as trimethylolpropane triacrylate, pentaerythritol tetraacrylate, and dipentaerythritol hexaacrylate; acrylates of ethylene oxide adducts or propylene oxide adducts of polyhydric alcohols such as trimethylolpropane and hydrogenated bisphenol A or polyhydric phenols such as bisphenol A and biphenol; polyfunctional or monofunctional polyurethane acrylates which are aforementioned hydroxyl group-containing acrylates modified with isocyanate; epoxy acrylates which are (meth) acrylic acid adducts of bisphenol A diglycidyl ether, hydrogenated bisphenol A diglycidyl ether or phenol novolak epoxy resin, and methacrylates corresponding to the acrylates enumerated above may be cited. These compounds may be used either singly or in the form of a combination of two or more members. Among other compounds cited above, polyfunctional (meth)acrylate compounds having two or more (meth)acryloyl groups in their molecules prove to be particularly desirable.

As the photopolymerization initiators (D) mentioned above, for example, benzoin and alkyl ethers thereof such as benzoin, benzoin methyl ether, benzoin ethyl ether, and benzoin isopropyl ether; acetophenones such as acetophenone, 2,2-dimethoxy-2-phenyl acetophenone, 2,2-diethoxy-2-phenyl acetophenone, and 1,1-dichloroacetophenone; aminoacetophenones such as 2-methyl-1-[4-(methylthio)phenyl]-2-morpholinopropanone-1, 2-benzyl-2-dimethylamino-1-(4-morpholinophenyl)-butane-1-one, and N,N-dimethylaminoacetophenone; anthraquinones such as 2-methylanthraquinone, 2-ethylanthraquinone, 2-t-butylanthraquinone, and 1-chloroanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; bisimidazoles; benzophenones such as benzophenone and 4,4'-bis (diethylamino)benzophenone or xanthones; and 2,4,6-trimethylbenzoyl diphenyl phosphine oxide may be cited. These well known and widely used photopolymerization initiators may be used either singly or in the form of a mixture of two or more members, or further in combination with a photo-initiator aid such as tertiary amines like N,N-(dimethylamino)ethylbenzoate, N,N-(dimethylamino) isoamylbenzoate, penthyl-4-dimethylaminobenzoate, triethyl amine, and triethanol amine. Further, a titanothene compound such as CGI-784 (product of Ciba Specialty Chemicals Inc.) and the like which exhibit absorption in a visible region may be added to promote the photochemical reaction. Particularly preferred photopolymerization initiator is 2-methyl-1-[4-(methylthio)phenyl]-2-morpholinopropanone-1, 2-benzyl-2-dimethylamino-1-(4-morpholinophenyl)-butane-l-one, etc., but not limited to these compounds. Any compounds which absorb light in the ultraviolet region or visible region and cause radical polymerization of the unsaturated groups such as (meth)acryloyl groups may be used either singly or in the form of a combination of two or more members irrespective of the photopolymerization initiator or the photo-initiator aid. The amount of the photopolymerization initiator to be used suitably falls in the range of 0.5 to 25 parts by weight, based on 100 parts by weight of the aforementioned photosensitive prepolymer (B).

As the. epoxy resins (E) mentioned above, any well known and widely used epoxy resins, for example, glycidyl ether compounds such as bisphenol A type epoxy resins, bisphenol F type epoxy resins, bisphenol S type epoxy resins, brominated bisphenol A type epoxy resins, hydrogenated bisphenol A type epoxy resins, biphenol type epoxy resins, bixylenol type epoxy resins, phenol novolak type epoxy resins, cresol novolak type epoxy resins, brominated phenol novolak type epoxy resins, bisphenol A novolak type epoxy resins, trihydroxyphenyl methane type epoxy resins, tetraphenylol ethane type epoxy resins, naphthalene skeleton-containing phenol novolak type epoxy resins, and dicyclopentadiene skeleton-containing phenol novolak type epoxy resins; glycidyl ester compounds such as diglycidyl terephthalate, diglycidyl hexahydrophthalate, and diglycidyl esters of dimer acid; alicyclic epoxy resins represented by EHPE-3150 (trade name) produced by Daicel Chemical Industries, Ltd.; heterocyclic epoxy resins such as triglycidyl isocyanurate; glycidylamines such as N,N,N',N'-tetraglycidyl methaxylene diamine, N,N,N',N'-tetraglycidyl bis(aminomethyl) cyclohexane, and N,N-diglycidyl aniline; and any well known and widely used epoxy compounds such as copolymers of glycidyl (meth)acrylate and a compound containing an ethylenically unsaturated double bond may be used. Among other epoxy resins cited above, phenol novolak type epoxy resins, cresol novolak type epoxy resins, biphenol type or bixylenol type epoxy resins or mixtures thereof, and triglycidyl isocyanurate prove to be particularly desirable in view of the finger touch dryness and heat resistance of the obtained coating film. These epoxy resins may be used either singly or in the form of a combination of two or more members.

The epoxy resins (E) mentioned above contribute to the improvement in such properties as adhesiveness and heat resistance of the solder resist through their thermal cure. The proper amount of the epoxy resin to be incorporated in the composition is in such a ratio that the epoxy group is in the range of 0.8 to 2.0 equivalent weights, preferably 1.0 to 1.8 equivalent weights per one equivalent weight of the carboxyl group of the aforementioned photosensitive prepolymer (B). If the amount of the epoxy resins to be incorporated is in such a range that the epoxy group is less than 0.8 equivalent weight, the unreacted carboxyl groups will remain, the hygroscopicity of the cured film will tend to become so high that the PCT resistance will be degraded, and the resistance to soldering heat and resistance to electroless plating will be degraded. Conversely, if the amount of the epoxy resins to be incorporated is in such a range that the epoxy group exceeds 2.0 equivalent weights, the developing properties of the coating film and the resistance to electroless plating of the cured film will be degraded and the PCT resistance will also be degraded.

As the curing catalysts (F), for example, imidazole and imidazole derivatives such as 2-methylimidazole, 2-ethylimidazole, 2-ethyl-4-methylimidazole, 2-phenylimidazole, 4-phenylimidazole, 1-cyanoethyl-2-phenylimidazole, and 1-cyanoethyl-2-ethyl-4-methylimidazole; amine compounds such as dicyandiamide, benzyldimethyl amine, 4-(dimethylamino)-N,N-dimethylbenzyl amine, 4-methoxy-N,N-dimethylbenzyl amine, and 4-methyl-N,N-dimethylbenzyl amine; hydrazides of organic acid such as hydrazide adipate and hydrazide sebacate; and phosphorus compound such as triphenylphosphine may be used. The curing catalysts which are commercially available include products of Shikoku chemicals co., Ltd., 2MZ-A, 2MZ-OK, 2PHZ, 2P4BHZ, and 2P4MHZ (invariably trade names for imidazole type compounds) and products of Sun-Apro K.K., U-CAT3503X and U-CAT3502X (invariably trade names for isocyanate compounds blocked with dimethyl amine) and DBU, DBN, U-CATSA102, and U-CAT5002 (invariably trade names for dicyclic amizine compounds and salts thereof), for example. The curing catalysts are not limited to the compounds cited above and any curing catalysts for epoxy resin and any compounds which can promote the reaction of epoxy groups with carboxyl groups may be used. The curing catalysts, may be used either singly or in the form of a mixture of two or more members. Furthermore, S-triazine derivatives which also act as an adhesiveness-imparting agent, such as guanamine, acetoguanamine, benzoguanamine, melamine, 2,4-diamino-6-methacryloyloxyethyl-S-triazine, 2-vinyl-4,6-diamino-S-triazine, isocyanuric acid adduct of 2-vinyl-4,6-diamino-S-triazine, isocyanuric acid adduct of 2,4-diamino-6-methacryloyloxyethyl-S-triazine can also be used, preferably in combination with the curing catalysts mentioned above. The amount of the curing catalyst mentioned above to be incorporated in the composition may be in the conventionally used range, for example., in the range of 0.1 to 20 parts by weight, preferably 0.5 to 15.0 parts by weight, based on 100 parts by weight of the photosensitive prepolymer (B) mentioned above.

The photocurable and thermosetting resin composition of the present invention may incorporate an organic solvent therein for the purpose of dissolving the photosensitive prepolymer (B) and the photosensitive (meth)acrylate compound (C) mentioned above and adjusting the viscosity of the composition to a level suitable for the coating method. As the organic solvents, for example, ketones such as methylethyl ketone and cyclohexanone; aromatic hydrocarbons such as toluene, xylene, and tetramethyl benzene; glycol ethers such as cellosolve, methyl cellosolve, butyl cellosolve, carbitol, methyl carbitol, butyl carbitol, propylene glycol monomethyl ether, propylene glycol monoethyl ether, dipropylene glycol monomethyl ether, dipropylene glycol diethyl ether, and triethylene glycol monoethyl ether; acetates such as ethyl acetate, butyl acetate, cellosolve acetate, butyl cellosolve acetate, carbitol acetate, butyl carbitol acetate, propylene glycol monomethylether acetate, and dipropylene glycol monomethyl ether acetate; alcohols such as ethanol, propanol, ethylene glycol, and propylene glycol; aliphatic hydrocarbons such as octane and decane; and petroleum solvents such as petroleum ether, petroleum naphtha, hydrogenated petroleum naphtha, and solvent naphtha may be cited. These organic solvents may be used either singly or in the form of a combination of two or more members. Though the organic solvent may be used in an arbitrary amount depending on the kind of method adopted for the application of the composition, it is desired to be not more than 300 parts by weight, preferably not more than 100 parts by weight, based on 100 parts by weight of the photosensitive prepolymer (B) mentioned above, from the viewpoint of the coating property of the composition and securing a suitable film thickness.

The photocurable and thermosetting resin composition of the present invention may further incorporate therein an inorganic filler and an organic filler which do not emit alpha rays for the purpose of increasing strain relaxation, imparting the flame retardancy, and improving the thermal conductivity.

As the inorganic fillers, for example, aluminum hydroxide obtained by the electrolytic process, a high purity alumina obtained by calcination thereof, an ultrafine silica powder (fume-like silica) obtained by hydrolyzing a purified silicone compound in oxygen-hydrogen flame, and a silicon nitride powder may be cited.

As the organic fillers, for example, polyethylene, polypropylene, polystyrene, acrylonitrile-styrene copolymer, acrylonitrile-butadiene-styrene copolymer, polycarbonate, various acrylates such as the polymethyl methacrylate,, polyimide, polyamide, polyester, polyvinyl chloride, polyvinylidene chloride, polydivinyl benzene, fluoroplastics, polyphenylene oxide, polyphenylene sulfide, polymethyl penten, urea resin, melamine resin, benzoguanamine resin, polyacetal resin, furan resin, silicone resin, polyurethane resin, and cured product of epoxy resin may be cited.

The amount of such inorganic fillers or organic fillers which do not emit alpha rays to be incorporated into the composition is desired to be not more than 20 parts by weight, preferably not more than 10 parts by weight, based on 100 parts by weight of the photosensitive prepolymer (B) mentioned above.

The composition of the present invention may further incorporate therein, as occasion demands, any of known and commonly used coloring agents such as phthalocyanine blue, phthalocyanine green, iodine green, disazo yellow, crystal violet, titanium oxide, carbon black, and naphthalene black, any of known and commonly used thermal polymerization inhibitors such as hydroquinone, hydroquinone monomethyl ether, t-butyl catechol, pyrogallol, and phenothiazine, silicone type, fluorine type, or macromolecular type anti-foaming agents and/or leveling agents, silane coupling agents such as imidazole-based compound, thiazole-based compound, and triazole-based compound, or any other known and commonly used additives.

The amount of such additives to be incorporated into the composition is desired to be not more than 10 parts by weight, preferably not more than 5 parts by weight, based on 100 parts by weight of the photosensitive prepolymer (a) mentioned above.

The photocurable and thermosetting resin composition of the present invention having such a composition as described above is adjusted to a level of viscosity suitable for a particular coating method by dilution when necessary, then applied by the technique of screen printing, curtain coating, spray coating, roll coating, or the like to a printed circuit board having a circuit formed in advance thereon, and then dried at a temperature in the range of 60 to 100° C., for example, to expel by evaporation the organic solvent contained in the composition to produce a tuck-free coating film.

Alternatively, a dry film is formed from the aforementioned composition as described below and laminated on a printed circuit board having a circuit formed in advance thereon.

In the manufacture of a dry film, the photocurable and thermosetting resin composition of the present invention is diluted with an organic solvent mentioned above to a level of suitable viscosity, applied to a supporting film by means of a film coater etc. and then dried. The proper thickness of the coating film is usually in the range of 15 to 80 μm, preferably 20 to 60 μm, as the thickness after drying.

The application of the composition on the supporting film may be carried out by various coating methods using a knife coater, a comma coater, a die coater, a gravure coater, a roll coater, a spray coater, etc. As the supporting film, various films, for example, a polyester film such as polyethylene terephthalate film, a polyamide-imide film, a polypropylene film, and a polystyrene film may be used.

After the composition is applied onto the supporting film, a film can be obtained by drying the composition usually at a temperature in the range of 50 to 130° C. for 1 to 30 minutes. It is preferred to protect the film by a strippable cover film laminated thereon for the purpose of preventing the surface of the film from the attachment of dust.

As the strippable cover film, any film such as, for example, a polyethylene film, a polytetrafluoroethylene film, a polypropylene film, and a surface-treated paper may be used as long as the adhesive strength between the cover film and the coating film is smaller than that between the coating film and the supporting film when the cover film is stripped from the coating film.

Thereafter, the coating film prepared according to either method described above is selectively exposed to active energy rays through a photomask having a prescribed exposure pattern and the unexposed area of the coating film is developed with an aqueous alkali solution to form a resist pattern. The film formed in the prescribed pattern as described above is finally cured (finish curing) by irradiation with active energy rays and subsequent heating, or by heating and subsequent irradiation with active energy rays, or by heating only to give birth to a cured film (solder resist film) which excels in adhesiveness, hardness, resistance to soldering heat, resistance to chemicals, resistance to solvents, electrical insulating properties, resistance to electrolytic corrosion, resolving power, resistance to plating, PCT resistance, and resistance to moisture absorption. Particularly when the process of irradiation with active energy rays and subsequent thermal curing or by thermal curing and subsequent irradiation with active energy rays is carried out, the reaction of the unreacted photosensitive groups takes place and thus the cured film excelling in resistance to electrolytic corrosion, resistance to plating, and resistance to moisture absorption can be obtained.

As an aqueous alkali solution to be used in the development mentioned above, aqueous alkali solutions of potassium hydroxide, sodium hydroxide, sodium carbonate, potassium carbonate, sodium phosphate, sodium silicate, ammonia, amines, etc. can be used. As the light sources which are used for the purpose of photocuring the composition, a low-pressure mercury vapor lamp, a medium-pressure mercury vapor lamp, a high-pressure mercury vapor lamp, an ultra-high-pressure mercury vapor lamp, a xenon lamp, a metal halide lamp, etc. can be advantageously used. Also, a laser beam may be used as the active energy rays.

Now, the present invention will be more specifically described below with reference to working examples and comparative examples. Wherever "parts" is mentioned hereinbelow, they invariably refer to those based on weight unless otherwise specified.

SYNTHETIC EXAMPLE 1

In a four-necked flask equipped with a stirrer and a reflux condenser, 190 parts of a cresol novolak type epoxy resin, EPPN-201 (product of Nippon Kayaku K.K., epoxy equivalent; 190) and 215 parts of carbitol acetate added thereto were dissolved by heating. Then, 0.46 part of methyl hydroquinone as a polymerization inhibitor and 1.38 parts of triphenylphosphine as a reaction catalyst were added to the solution. The resultant mixture kept heated to 95–105° C. and 57.6 parts (0.8 equivalent) of acrylic acid and 44.0 parts (0.2 equivalent) of n-nonyl phenol gradually added dropwise thereto were left reacting for about 32 hours to obtain a reaction product having an acid value of 0.9 mg KOH/g. The reaction product (hydroxyl group: one equivalent) was cooled to 80–90° C. and made to add 91.2 parts (0.6 equivalent) of tetrahydrophthalic anhydride and they were left reacting for about 8 hours. The product was cooled and then extracted from the flask. The photosensitive prepolymer consequently obtained was found to have a nonvolatile content of 65% and an acid value of 84 mg KOH/g as solids. This varnish will be referred to hereinafter as "varnish B-1".

EXAMPLES 1 to 5 AND COMPARATIVE EXAMPLES 1 to 4

The components accounting for varying ratios of combination shown in Table 1 and using the varnish B-1 mentioned above were 20. kneaded with a three-roll mill to obtain photocurable and thermosetting resin compositions. The characteristics of these compositions were evaluated according to the methods to be described hereinafter. The results are shown in Table 2.

characteristics, but exhibited high radiation dose of alpha rays, which will increase the possibility of incorrect operation.

The characteristics shown in Table 2 mentioned above were determined by the following methods.

TABLE 1

| Components (parts by weight) | Example | | | | | Comparative Example | | | |
|---|---|---|---|---|---|---|---|---|---|
| | 1 | 2 | 3 | 4 | 5 | 1 | 2 | 3 | 4 |
| Low alpha ray silica *1) | 27 | 67 | 105 | — | 52.5 | — | — | — | — |
| Low alpha ray silica *2) | — | — | — | 105 | 52.5 | — | — | — | — |
| Barium sulfate *3) | — | — | — | — | — | 105 | — | — | — |
| Talc *4) | — | — | — | — | — | — | 105 | — | — |
| Crystaline silica *5) | — | — | — | — | — | — | — | 105 | — |
| Varnish B-1 | 154 | 154 | 154 | 154 | 154 | 154 | 154 | 154 | 154 |
| Dicyandiamide | 0.5 | 0.5 | 0.5 | 0.5 | 0.5 | 0.5 | 0.5 | 0.5 | 0.5 |
| Phthalocyanine green | 1.0 | 1.0 | 1.0 | 1.0 | 1.0 | 1.0 | 1.0 | 1.0 | 1.0 |
| Irgacure 907 *6) | 10 | 10 | 10 | 10 | 10 | 10 | 10 | 10 | 10 |
| DPM *7) | 5 | 5 | 5 | 5 | 5 | 5 | 5 | 5 | 5 |
| EPPN-501H/CA80 *8) | 40 | 40 | 40 | 40 | 40 | 40 | 40 | 40 | 40 |
| YX-4000 *9) | 10 | 10 | 10 | 10 | 10 | 10 | 10 | 10 | 10 |
| DPHA *10) | 12.5 | 12.5 | 12.5 | 12.5 | 12.5 | 12.5 | 12.5 | 12.5 | 12.5 |
| Total | 271 | 336 | 349 | 349 | 349 | 349 | 349 | 349 | 244 |

Remarks
*1) Low alpha ray silica, FR-20X, produced by Denki Kagaku Kogyo K.K., average particle diameter = 5.0 μm, uranium content = 0.4 ppb or less
*2) Low alpha ray silica, SO-E5, produced by Tatsumori K.K., average particle diameter = 1.6 μm, uranium content = 0.3 ppb or less
*3) B-30 produced by Sakai Kagaku K.K.
*4) LMP-100 produced by Fuji Talc K.K.
*5) Crystaline silica, Imusil A-8 produced by Tatsumori K.K.
*6) Photopolymerization initiator produced by Ciba Specialty Chemicals Inc.
*7) Dipropylene glycol monomethyl ether produced by Dow Chemicals Inc.
*8) Vanish obtained by dissolving 80 parts of salicylaldehyde type epoxy resin produced by Nippon Kaayaku K.K. in 20 parts of carbitol acetate
*9) bixylenol type epoxy resin produced by Japan Epoxy Resin K.K.
*10) Dipentaerythritol hexaacrylate produced by Nippon Kayaku Co., Ltd.

TABLE 2

| Properties | Composition Example | | | | | Comparative Composition Example | | | |
|---|---|---|---|---|---|---|---|---|---|
| | 1 | 2 | 3 | 4 | 5 | 1 | 2 | 3 | 4 |
| (1) Printability | ○ | ○ | ○ | ○ | ○ | ○ | ○ | ○ | Δ |
| (2) Resistance to soldering heat | ○ | ○ | ○ | ○ | ○ | ○ | ○ | ○ | x |
| (3) Adhesiveness | ○ | ○ | ○ | ○ | ○ | ○ | ○ | ○ | x |
| (4) Resistance to electroless plating | ○ | ○ | ○ | ○ | ○ | ○ | ○ | ○ | x |
| (5) Resistance to solvents | ○ | ○ | ○ | ○ | ○ | ○ | ○ | ○ | ○ |
| (6) Resistance to acids | ○ | ○ | ○ | ○ | ○ | ○ | ○ | ○ | ○ |
| (7) PCT resistance | ○ | ○ | ○ | ○ | ○ | ○ | ○ | ○ | x |
| (8) TC resistance | ○ | ○ | ○ | ○ | ○ | ○ | ○ | ○ | x |
| (9) Alpha dose (c/cm$^2$ · h) | <0.001 | <0.001 | <0.001 | <0.001 | <0.001 | 0.014 | 0.035 | 0.007 | 0 |

As being clear from the results shown in Table 2, the cured films prepared from the photocurable and thermosetting resin composition of Examples of the present invention emitted alpha rays which affect semiconductor elements in a fully low dose of not exceeding 0.001 c/cm$^2$·h and excelled in such properties as printability, resistance to soldering heat, adhesiveness, resistance to electroless plating, resistance to chemicals, PCT resistance, and resistance to thermal shock. On the contrary, in the case of the composition of Comparative Example containing a general-purpose inorganic filler, the resultant cured film showed no problem in (1) Printability:
Each of the compositions of Examples and comparative Examples mentioned above was applied by the screen printing method to the entire surface of a copper-clad substrate having a prescribed pattern formed in advance thereon. The printed substrate was visually examined to evaluate the printability.
○: No problem in printing
Δ: Occurrence of skips or cissing in part
X: Occurrence of skips or cissing in whole Each of the compositions of Examples and Comparative Examples mentioned above was applied by the screen printing method to the entire surface of a copper-clad substrate having a prescribed pattern formed in advance thereon, dried at 80° C. for 20 minutes, and left cooling to room temperature. The samples to be used for measuring alpha rays were applied by printing twice under the same conditions. The substrate was exposed to light according to a prescribed solder resist pattern through a negative film superposed thereon at an exposure dose of 600 mJ/cm$^2$ and then developed for 60 seconds with an aqueous 1 wt % Na$_2$CO$_3$ solution of 30° C. under a spray pressure of 2 kg/cm$^2$ to form a resist pattern. This substrate was irradiated with UV light in a UV conveyer furnace under the condition of cumulative exposure dose of 1000 mJ/cm$^2$ and then thermally cured at 150° C. for 60 minutes to produce a test substrate for the following tests.

(2) Resistance to Soldering Heat:

A test substrate coated with a rosin-based flux was repeatedly immersed in a solder bath kept at 260° C. and visually examined the blister or separation of the resist layer after washing the flux with a denatured alcohol. The criterion for evaluation is as follows;

○: Separation was not found even when the immersion for 10 seconds was repeated three times or more.

Δ: Slight separation was found when the immersion for 10 seconds was repeated three times or more.

X: Blister and separation were found when the immersion for 10 seconds was repeated three times or less.

(3) Adhesiveness:

The resist layer on the test substrate was incised like cross-cut in the shape of squares in a go board and then subjected to a peeling test with an adhesive tape in accordance with the method specified in JIS (Japanese Industrial Standard) D 0202 to evaluate the separation of the resist layer. The criterion for evaluation is as follows:

○: Absolutely no peeling of the resist layer observed

Δ: Slight peeling of the resist layer observed

X: Peeling of the resist layer observed.

(4) Resistance to Electroless Plating:

Each test substrate was plated successively in an electroless nickel plating bath and an electroless gold plating bath, both available in the market, under the conditions of 0.5 μm of nickel and 0.03 μm of gold and then subjected to a tape peeling test to determine whether or not the resist layer was separated and whether or not the resist layer had been infiltrated with the plating medium. Thereafter, the resist layer on the test substrate was incised like cross-cut in the shape of squares in a go board and then subjected to a peeling test with an adhesive tape in the same manner as the testing method for (4) adhesiveness mentioned above to evaluate the separation of the resist layer. The criterion for evaluation is as follows:

○: Absolutely no peeling of the resist layer observed

Δ: Slight peeling of the resist layer observed

X: Peeling of the resist layer observed (5) Resistance to Solvents:

The test substrate mentioned above was immersed in propylene glycol methyl ether acetate at room temperature for 30 minutes. Thereafter, the resist layer on the test substrate was incised like cross-cut in the shape of squares in a go board and then subjected to a peeling test with an adhesive tape in the same manner as the testing method for (4) adhesiveness mentioned above to evaluate whether or not the resist layer was separated. The criterion for evaluation is as follows:

○: Absolutely no peeling of the resist layer observed

Δ: Slight peeling of the resist layer observed

X: Peeling of the resist layer observed (6) Resistance to Acids:

The test substrate mentioned above was immersed in an aqueous 10 vol. % sulfuric acid solution at room temperature for 30 minutes. Thereafter, the resist layer on the test substrate was incised like cross-cut in the shape of squares in a go board and then subjected to a peeling test with an adhesive tape in the same manner as the testing method for (4) adhesiveness mentioned above to evaluate whether or not the resist layer was separated. The criterion for evaluation is as follows:

○: Absolutely no peeling of the resist layer observed

Δ: Slight peeling of the resist layer observed

X: Peeling of the resist layer observed (7) PCT Resistance:

The test substrate mentioned above was treated in a PCT apparatus (TABAI ESPEC HAST SYSTEM TPC-412MD) for 168 hours under the conditions of 121° C., 2 atmospheric pressure, and examined the state of the cured film.

○: No discernible separation, discoloration, or melting of the cured film observed Δ: Occurrence of either of separation, discoloration, or melting of the cured film observed X: Conspicuous separation, discoloration, or melting of the cured film observed (8) Resistance to Thermal Shock (TC):

The test substrate mentioned above was placed in a thermal shock tester and subjected to the heat cycle test under the conditions of 1,000 cycles between −45° C.×15 minutes and 125° C.×15 minutes. After completion of this test, the test substrate was observed through a microscope to investigate whether or not the cracks occurred.

○: No change in appearance such as cracks observed

Δ: Occurrence of cracks observed in part

X: Occurrence of cracks observed in whole (9) alpha radiation dose

A solder resist cured film was formed on a PET film under the same conditions as mentioned above. The cured film was separated from the PET film and tested for the alpha radiation dose under the following conditions:

Measurement Conditions:

Apparatus: Low level alpha rays measuring apparatus LACS-4000

Applied voltage: 1.9 kV

Counting gas: PR-10 gas (Ar 90%, CH$_4$ 10%), 100 ml/min.

Surface area of sample: 4000 cm$^2$

Total counting time: 99 hours

Counting efficiency: 80%

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and the range of equivalency of the claims are, therefore, intended to be embraced therein.

What is claimed is:

1. An alkali-developable, photocurable and thermosetting solder resist composition, comprising: (A) a high purity synthetic silica powder having a uranium content of not more than 1.0 ppb, (B) a photosensitive prepolymer containing a carboxylic group and at least two ethylenically unsaturated groups in its molecule and having an acid value of solid content of 50 to 150 mg KOH/g, (C) a photosensitive (meth)acrylate compound, (D) a photopolymerization initiator, (E) an epoxy resin, and (F) a curing catalyst, wherein said high purity synthetic silica powder has an average particle diameter of not more than $10.0\,\mu m$ and is present in an amount of 5 to 40 parts by weight, based on 100 parts by weight of the composition, and said photosensitive prepolymer (B) is at least one compound selected from the group consisting of:

(1) a photosensitive prepolymer obtained by the reaction of (a) a polyfunctional epoxy compound having at least two epoxy groups in its molecule with (b) an unsaturated monocarboxylic acid and the subsequent reaction of (c) a saturated or unsaturated polybasic acid anhydride with a hydroxyl group caused by said reaction, (2-1) a photosensitive prepolymer obtained by the reaction of (a) a polyfunctional epoxy compound having at least two epoxy groups in its molecule with (b) an unsaturated monocarboxylic acid and (d-1) a compound having one reactive group other than an alcoholic hydroxyl group capable of reacting with an epoxy group in its molecule, and the subsequent reaction of (c) a saturated or unsaturated polybasic acid anhydride with a product of said reaction, and (2-2) a photosensitive prepolymer obtained by the reaction of (a) a polyfunctional epoxy compound having at least two epoxy groups in its molecule with (b) an unsaturated monocarboxylic acid and (d-2) a compound having at least one alcoholic hydroxyl group and one reactive group other than an alcoholic hydroxyl group capable of reacting with an epoxy group in its molecule, and the subsequent reaction of (c) a saturated or unsaturated polybasic acid anhydride with a product of said reaction.

2. The composition according to claim 1, further comprising an organic solvent.

3. The composition according to claim 1, further comprising a filler other than said high purity synthetic silica powder which does not emit alpha rays.

4. The composition according to claim 1, further comprising at least one compound selected from the group consisting of a coloring agent, a thermal polymerization inhibitor, an anti-foaming agent, a leveling agent, and a silane coupling agent.

5. A cured film obtained by a method which comprises:

a step of forming a resist pattern on a substrate by forming a film of the photocurable and thermosetting solder resist composition set forth in claim 1 on the substrate and subjecting the resultant film to exposure to light and development, and a step of curing the film of the resultant resist pattern.

6. The cured film according to claim 5, wherein said formation of the film on the substrate is performed by applying the photocurable and thermosetting resin composition to the substrate and drying it.

7. The cured film according to claim 5, wherein said formation of the film on the substrate is performed by laminating a dry film of the photocurable and thermosetting resin composition on the substrate.

8. The cured film according to claim 5, wherein said step of curing the coating film is carried out by subjecting to irradiation with active energy rays and subsequent thermal curing, or to thermal curing and subsequent irradiation with active energy rays, or to thermal curing only.

9. A printed circuit board having a solder resist film formed on a circuit board provided with a conductor layer of a prescribed circuit pattern, wherein said solder resist film is formed from a cured film of the photocurable and thermosetting solder resist composition set forth in claim 1.

10. The printed circuit board according to claim 9, wherein said cured film is obtained by subjecting said composition to irradiation with active energy rays and/or thermal curing.

* * * * *